(12) United States Patent
Al-Absi et al.

(10) Patent No.: US 8,610,614 B1
(45) Date of Patent: Dec. 17, 2013

(54) CMOS CURRENT-MODE FOLDING AMPLIFIER

(71) Applicants: King Fahd University of Petroleum and Minerals, Dhahran (SA); King Abdulaziz City for Science and Technology, Riyadh (SA)

(72) Inventors: Munir A. Al-Absi, Dhahran (SA); Muhammad T. Abuela'Atti, Dhahran (SA); Shaker A. Mahemood, Dhahran (SA)

(73) Assignees: King Fahd University of Petroleum and Minerals, Dhahran (SA); King Abdulaziz City for Science and Technology, Riyadh (SA)

( * ) Notice: Subject to any disclaimer, the term of this patent is extended or adjusted under 35 U.S.C. 154(b) by 0 days.

(21) Appl. No.: 13/910,111

(22) Filed: Jun. 4, 2013

(51) Int. Cl.
*H03M 1/12* (2006.01)

(52) U.S. Cl.
USPC .......................................... 341/155; 330/288

(58) Field of Classification Search
USPC .................. 330/257, 288; 323/315–316; 341/155–161
See application file for complete search history.

(56) References Cited

U.S. PATENT DOCUMENTS

| | | | |
|---|---|---|---|
| 5,877,974 A | 3/1999 | Can | |
| 6,177,838 B1 | 1/2001 | Chiu | |
| 6,300,845 B1 | 10/2001 | Zou | |
| 8,089,388 B2 * | 1/2012 | Cui et al. | 341/158 |
| 2002/0180528 A1 | 12/2002 | Herrera et al. | |
| 2012/0092202 A1 * | 4/2012 | Petrellis et al. | 341/155 |

FOREIGN PATENT DOCUMENTS

| | | |
|---|---|---|
| CN | 101471631 A | 7/2009 |
| CN | 201813350 U | 4/2011 |

OTHER PUBLICATIONS

B. Nauta and A. Venes, "*A 70-Ms/s 110-mW 8-bit CMOS folding and interpolating A/D converter*," IEEE J. Solid-State Circuits, vol. 30, pp. 1302-1308, Dec. 1995.
Y. Li and E. Sanchez-Sinencio, "*Current Mirror Based Folding Amplifier*", IEEE 43rd Midwest Symposium on Circuits and Systems, vol. 1, pp. 60-63, Aug. 2000.

* cited by examiner

*Primary Examiner* — Hieu Nguyen
(74) *Attorney, Agent, or Firm* — Richard C. Litman

(57) ABSTRACT

A CMOS current-mode folding amplifier circuit is provided that uses MOSFETs operating in relatively strong inversion. The CMOS current-mode folding amplifier circuit produces a saw-tooth shaped input-output characteristic which provides for relative precision in flash-type analog-to-digital converters. Furthermore, the CMOS current-mode folding amplifier circuit uses a plurality of simple current mirrors, in addition to biasing currents, for defining the switching levels. Accordingly, the current-mode amplifier requires less area on the chip and consumes less power relative to other analog preprocessing circuits. Moreover, the CMOS current-mode folding amplifier circuit is resilient to process, temperature and power supply variations. Tanner simulation tools using 0.35 μm CMOS technology confirm the functionality of the current-mode folding amplifier.

19 Claims, 11 Drawing Sheets

CMOS CURRENT-MODE FOLDING AMPLIFIER

BACKGROUND OF THE INVENTION

1. Field of the Invention

The present invention generally relates to analog-to-digital converters, and particularly to folding amplifiers in analog-to-digital converters.

2. Description of the Related Art

The analog-to-digital converter (ADC) is an important building block to interface the analog world to the digital world. Such ADC circuits have many applications that are widely used in such areas as digital telephone transmission, cell phones, medical imaging and wireless nodes, for example.

ADCs are found to have varying architectures, each of which typically may have a unique set of characteristics and limitations. Accordingly, a suitable analog-to-digital conversion technique should be utilized, depending on the particular application and the characteristics and limitations of the selected ADC. The most common types of ADCs are flash, successive approximation and sigma-delta, for example. The relatively fastest and conceptually simplest conversion process is the full flash or parallel flash ADC. A problem with such ADC circuit is that for N-bit resolution, it typically requires $2^N-1$ comparators and $2^N$ resistors to generate reference voltages, which can lead to higher power consumption and larger silicon area.

Folding is a type of analog preprocessing that is used to produce more than one zero-crossing point. Folding is used to reduce the number of comparators, and thus, the power consumption and the silicon area of a flash ADC. The folding ADC is used to reduce the complexity of the flash ADC while substantially maintaining conversion speed. For (N=m+l) bits of resolution, for example, with m being the most significant bits and l being the least significant bits, the number of comparators required for the folding ADC is $2^m-1$ comparators for the MSBs and $2^l-1$ comparators for the LSBs. As such, the total number of comparators used in the folded ADC, $(2^m-1)+(2^l-1)$, can be reduced to less than half of the number of comparators used in the flash ADC, which is $2^N-1$.

The applications of complementary metal-oxide-semiconductor (CMOS) current-mode circuits have increased dramatically due to deficiencies of their voltage-mode counterparts, such deficiencies including, for example, lack of suitability for low voltage design due to voltage swing problems. Existing voltage-mode folding amplifiers are typically built around differential pairs which generally are not suitable for low voltage design because of nonlinearity problems. Moreover, the input-output characteristic of a differential based folding amplifier can result in digitization errors. And, a problem with existing current-mode folding amplifier implementations is the degradation of the conversion accuracy, which may also result in digitization errors.

Thus, a CMOS current-mode folding amplifier that addresses the aforementioned problems is desired.

SUMMARY OF THE INVENTION

A CMOS current-mode folding amplifier uses CMOS based electronics and current mirroring circuitry to enhance accuracy in analog-to-digital conversion. The CMOS current-mode folding amplifier circuit produces a saw-tooth input-output characteristic which enhances precision in folding analog-to-digital converters. The current-mode folding amplifier of the CMOS current-mode folding amplifier circuit includes a plurality of biasing currents for defining the switching levels and a plurality of current mirrors, for example, wherein metal-oxide-semiconductor field-effect transistors (MOSFETs) are operating in relatively strong inversion. Moreover, the CMOS current-mode folding amplifier circuit is relatively resilient to process, temperature and power supply variations. Therefore, the CMOS current-mode folding amplifier circuit typically requires less chip area and lower power consumption.

These and other features of the present invention will become readily apparent upon further review of the following specification and drawings.

BRIEF DESCRIPTION OF THE DRAWINGS

Unless otherwise indicated, similar reference characters denote corresponding features consistently throughout the attached drawings.

DETAILED DESCRIPTION OF THE PREFERRED EMBODIMENTS

Figure 1:
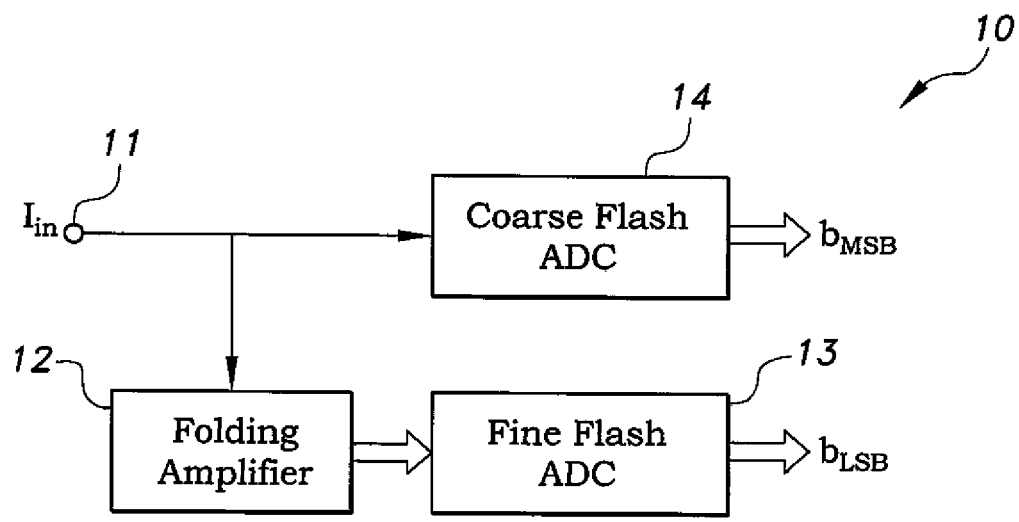
FIG. 1 is a block diagram of an illustrative embodiment of a flash-type current-mode folding ADC.

A block diagram of a flash-type current-mode folding ADC 10 is shown in FIG. 1. Referring to FIG. 1, folding is a type of analog preprocessing that is used to produce more than one zero-crossing point. Folding can reduce the number of comparators, consequently reducing the power consumption and the silicon area of a flash ADC. The current-mode folding ADC 10 includes an input terminal 11 for receiving an analog input signal, $I_{in}$, which is applied to an analog preprocessing circuit referred to as the folding amplifier 12. The output of the folding circuit is fed into to a fine quantizer, such as a Fine Flash ADC 13. The input signal is directly connected to a coarse quantizer, such as a Coarse Flash ADC 14. The coarse digital output $b_{MSB}$ represents the most significant bits (MSB) and the fine digital output $b_{LSB}$ will produce the least significant bits (LSB).

Figure 2:
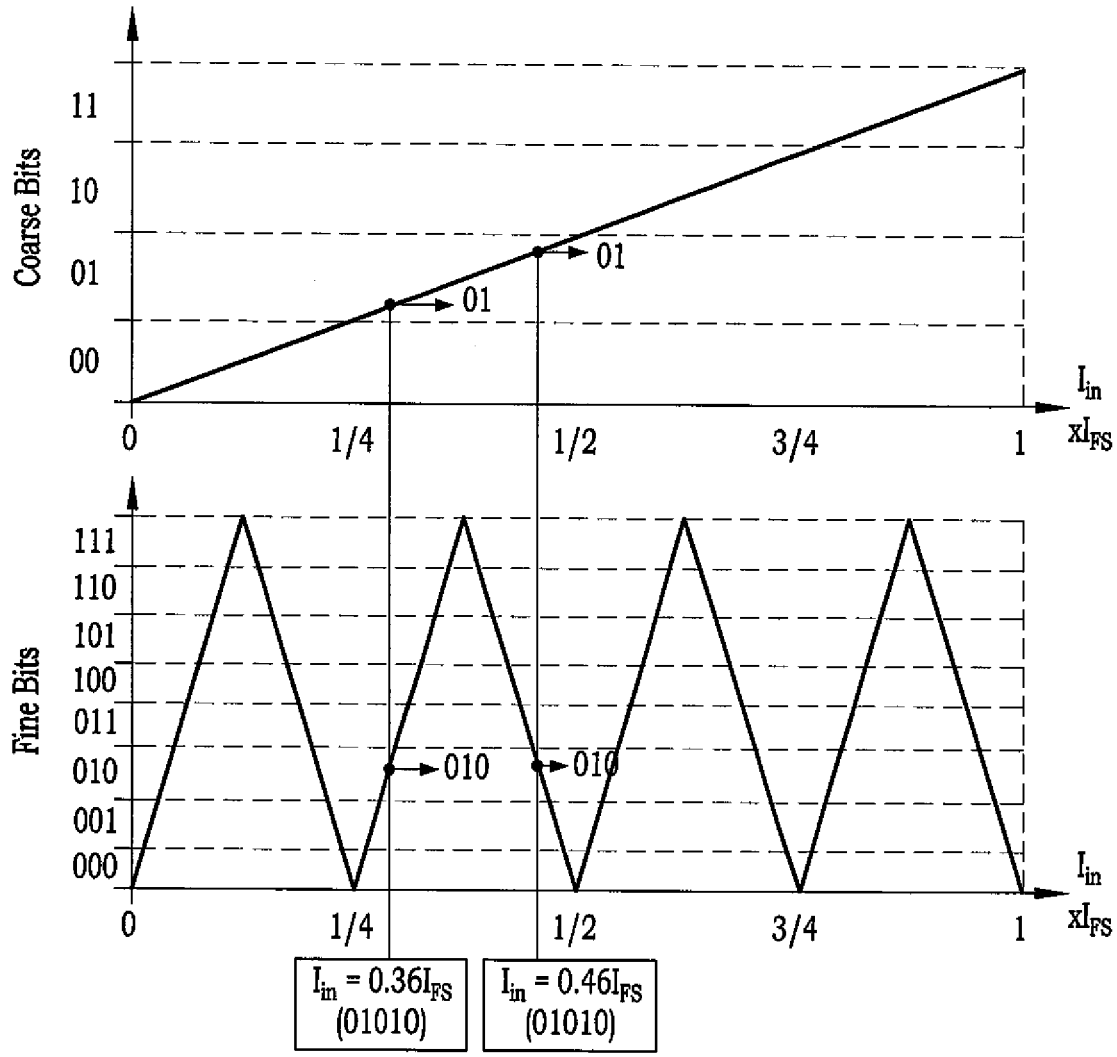
FIG. 2 is a graph showing a digitization error produced in an analog to digital conversion using a 5-bit folding ADC with a triangular-shaped output producing folding amplifier.
Figure 3:
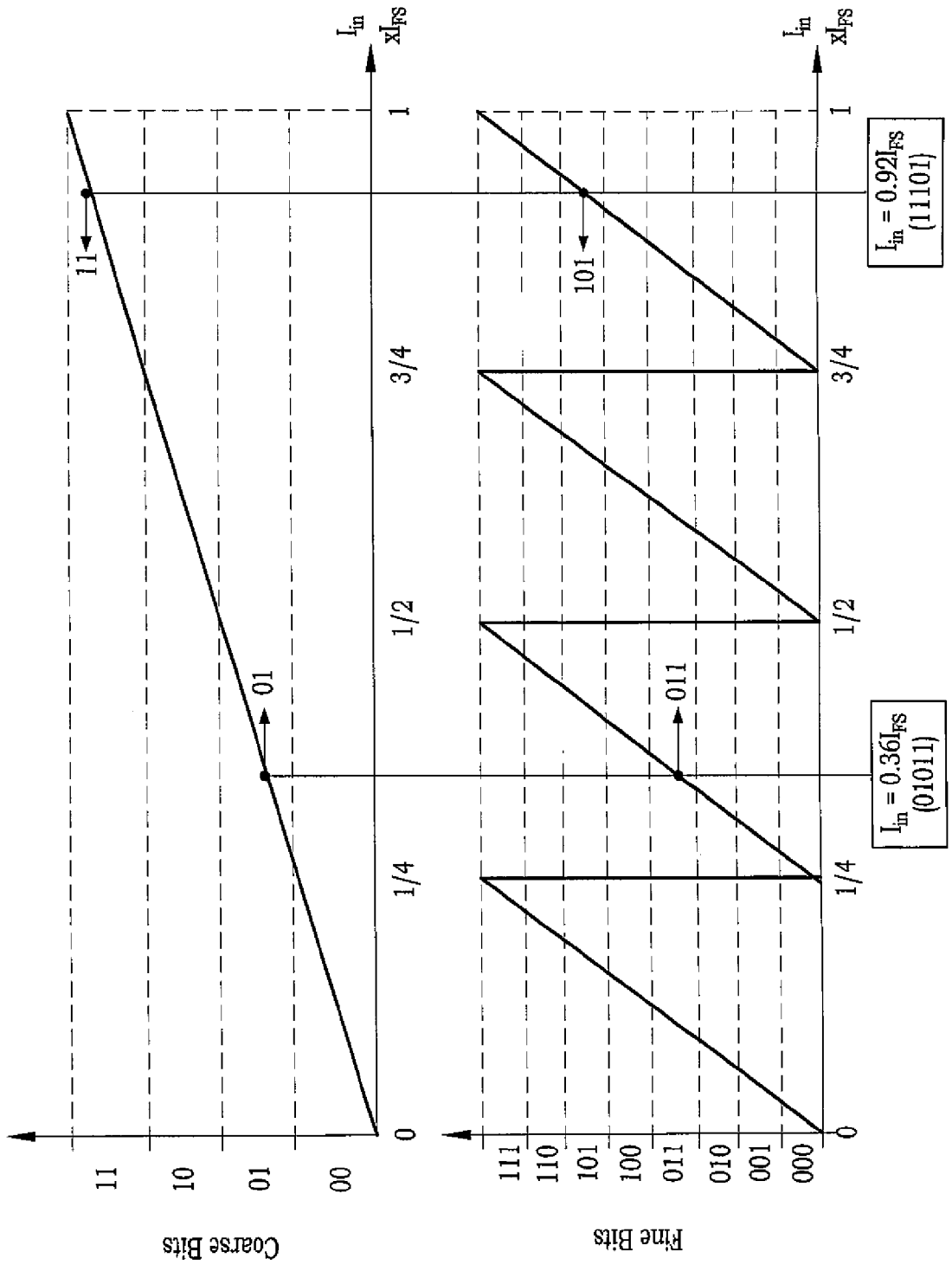
FIG. 3 is a graph showing the accuracy of an analog to digital conversion using a 5-bit folding ADC with a saw-tooth shaped output producing folding amplifier of a CMOS current-mode folding amplifier circuit according to the present invention.

The output of the folding amplifier 12 may lead to digitization errors if the architecture of the circuit produces an output which is triangular-shaped or sinusoidal-shaped. In this case, compensation would typically be required, such as using additional circuitry to address the resulting uncertainty. As shown in FIG. 2, the 5-bit folding ADC produces digitization errors due to the triangular-shaped output of the folding amplifier. Inspection of FIG. 2 shows that the digital output, 01010, is the same or substantially the same for the two different analog inputs, $0.36I_{FS}$ and $0.46I_{FS}$. As a result, as illustrated in FIG. 2, one digital output is imprecisely represented by two different analog inputs. In contrast, inspection of FIG. 3 shows that a saw-tooth input-output characteristic can eliminate, or minimize, the digitization error, where representing two differing analog inputs by two differing digital outputs with relative precision is enhanced.

Figure 4B:
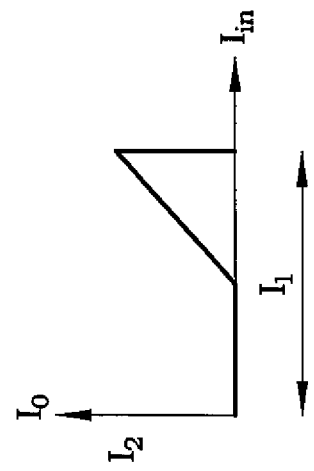
FIG. 4B is a graph illustrating the resulting output signal of the CMOS current-mode folding amplifier circuit from the sum of the Block 1 signal and the Block 2 signal of FIG. 4A.
Figure 4A:
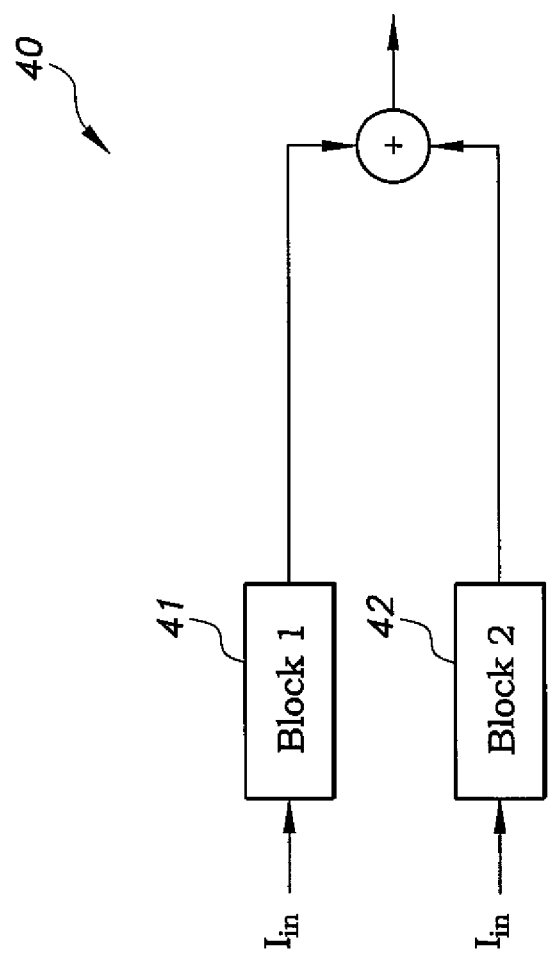
FIG. 4A is a block diagram of an exemplary embodiment of a current-mode folding amplifier of a CMOS current-mode folding amplifier circuit according to the present invention.

FIG. 4A is a simplified block diagram describing an exemplary structure of the folding amplifier 40 of a CMOS current-mode folding amplifier circuit having current mirrors that can be used in various embodiments, for example. The folding amplifier 40 includes circuitry, such as in FIGS. 5 and 7, for example, which is represented by Block 1 41 and Block 2 42. Each Block (41, 42) produces a corresponding signal, and thereafter the two signals are summed together to produce the saw-tooth input-output characteristic of embodiments of a CMOS current-mode folding amplifier circuit having current mirrors, such as shown in FIG. 4B.

Figure 5:
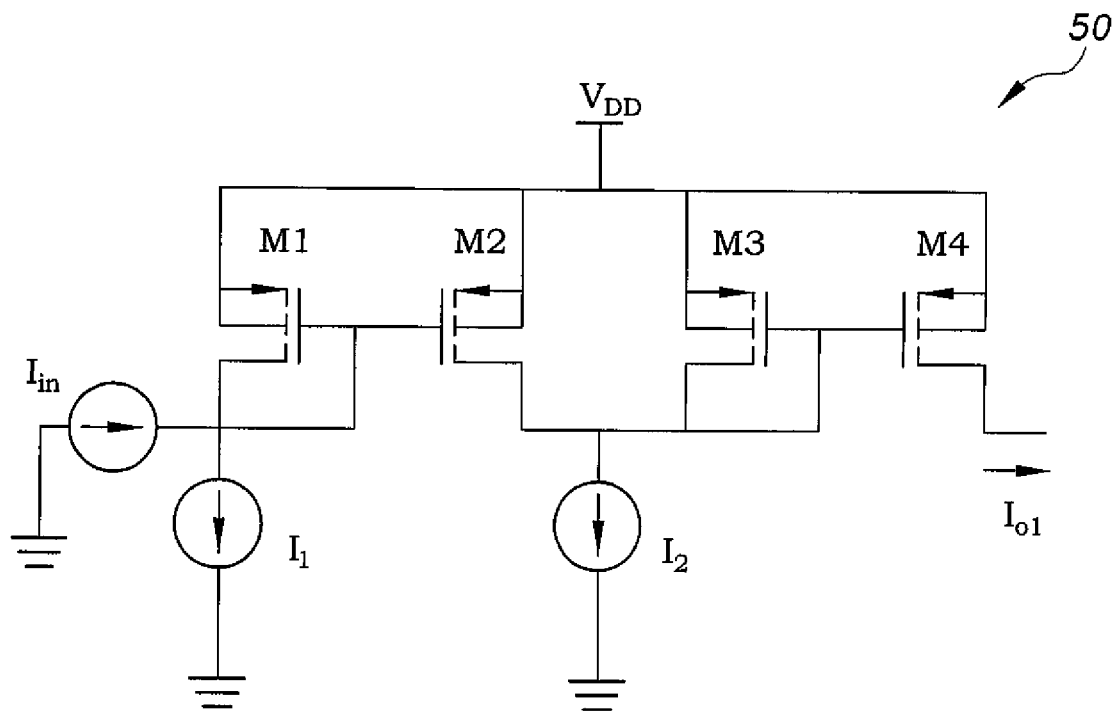
FIG. 5 is a schematic diagram of a circuit having current mirrors that can be used in a current-mode folding amplifier of a CMOS current-mode folding amplifier circuit according to the present invention.

FIG. 5 is a schematic diagram of a current mirroring circuit having current mirrors that can be used in a current-mode folding amplifier in embodiments of a CMOS current-mode folding amplifier circuit. An embodiment of the circuitry of Block 1 41 (FIG. 4A) is shown in FIG. 5. The current mirroring circuit 50 includes four MOSFETs, M1-M4, arranged in a current mirroring configuration, wherein the MOSFETs M1-M4 are configured to operate in an inversion region, for example. The first and second MOSFETs M1 and M2 form a first current mirror, and the third and fourth MOSFETs M3 and M4 form a second current mirror, with the two current mirrors being connected in cascade, such as arranged in a non-inverting cascade configuration, for example. Furthermore, the circuit 50 includes the current input, $I_{in}$, and current sources, $I_1$ and $I_2$, which provide biasing current to the circuit 50, thereby producing the output current $I_{O1}$, wherein the first current mirror is adapted to receive the current source input current, and the second current mirror is adapted to provide a first output current.

With reference to FIG. 5, the output current, $I_{O1}$, is given by:

$$I_{01} = I_2 \frac{\alpha_4}{\alpha_3} - I_1 \frac{\alpha_2 \alpha_4}{\alpha_1 \alpha_3} + I_{in} \frac{\alpha_2 \alpha_4}{\alpha_1 \alpha_3} \quad (1)$$

Where, $\alpha_i = W_i/L_i$ is the aspect ratio of transistor $M_i$
If $\alpha_1 = \alpha_2$ and $\alpha_3 = \alpha_4$ then:

$$I_{01} = I_2 - I_1 + I_{in} \quad (2)$$

Or $$I_{01} = \begin{cases} I_2, & \text{if } I_{in} \geq I_1 \\ 0, & \text{if } I_{in} \leq I_1 - I_2 \end{cases} \quad (3)$$

Figure 6:
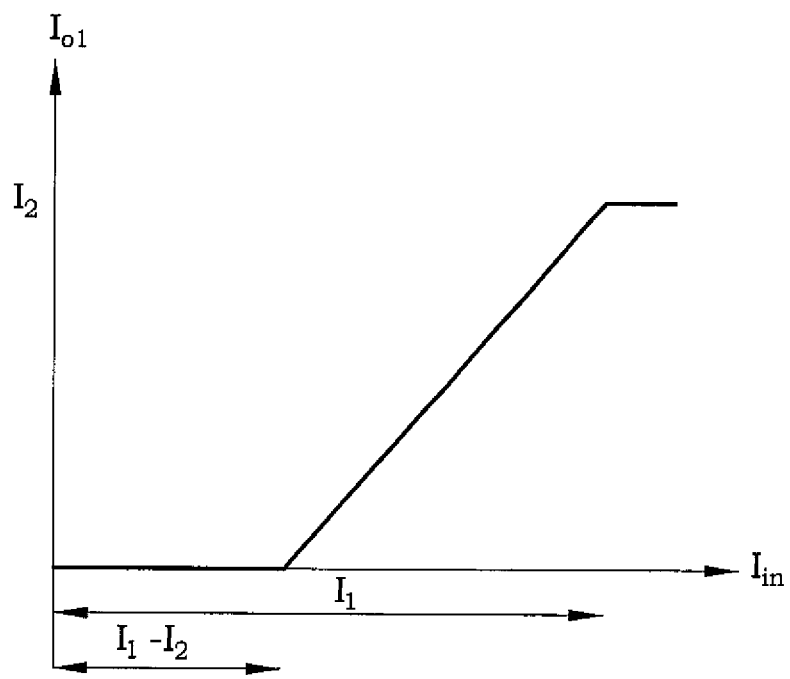
FIG. 6 is a graph showing a transfer curve, illustrating the output current as a function of the input current in a CMOS current-mode folding amplifier circuit according to the present invention.

FIG. 6 is a graph showing a transfer curve, illustrating the output current as a function of the input current in an embodiment of a CMOS current-mode folding amplifier circuit. The output current as a function of the input current for Block 1 41 is shown in FIG. 6. Inspection of the transfer curve shown in FIG. 6 and equation (3) shows that the circuit 50 is designed so that for small input currents, the output is zero or substantially zero. For relatively large currents the output current is constant or substantially constant and equal to $I_2$, where $I_2$ is the bias current.

Figure 7:
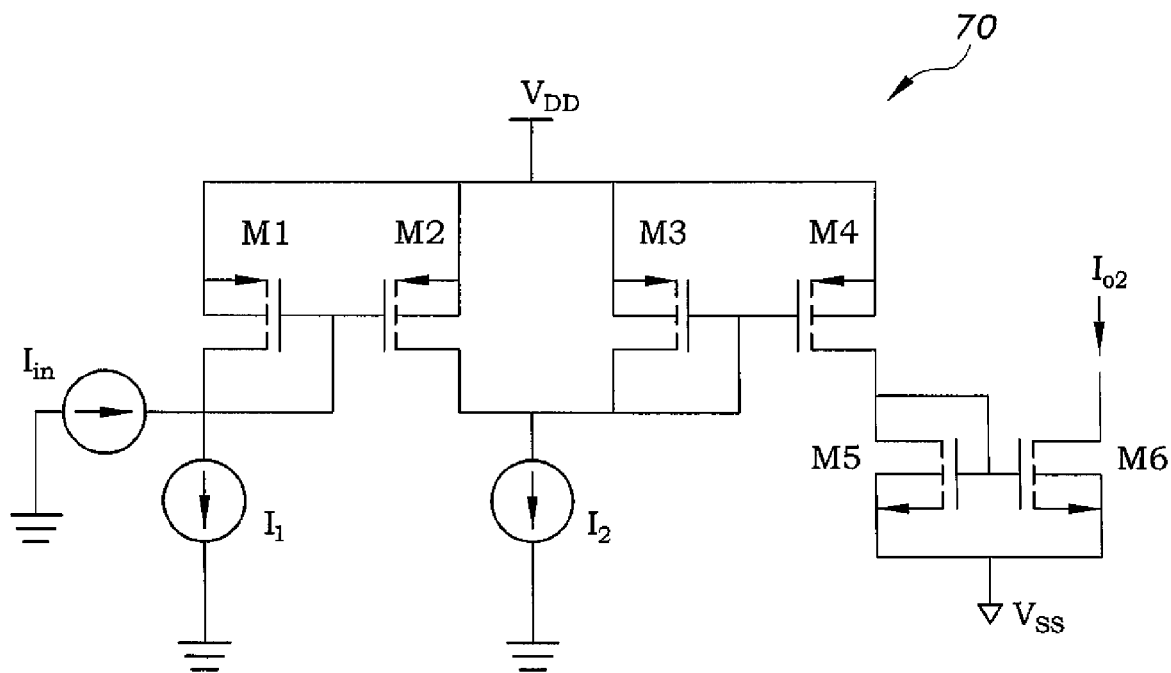
FIG. 7 is a schematic diagram of a circuit having current mirrors that can be used in a current-mode folding amplifier of a CMOS current-mode folding amplifier circuit according to the present invention.
Figure 8:
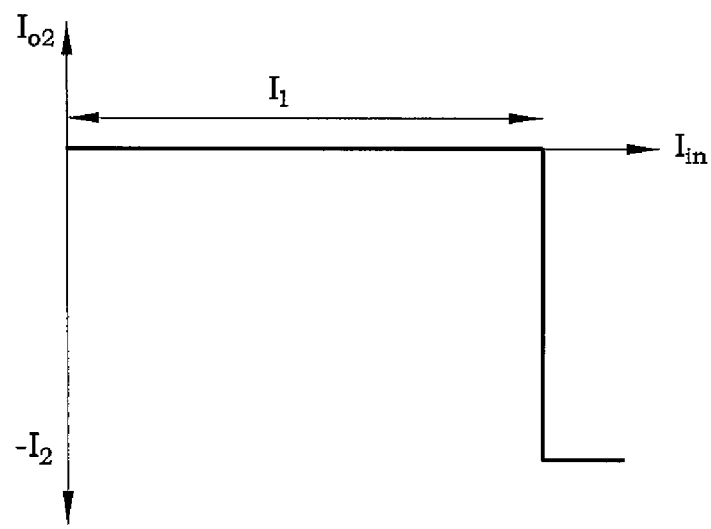
FIG. 8 is a graph showing the transfer curve of the circuit of FIG. 7, illustrating the output current as a function of the input current in a CMOS current-mode folding amplifier circuit according to the present invention.

FIG. 7 is a schematic diagram of a current mirroring circuit having current mirrors that can be used in a current-mode folding amplifier in embodiments of a CMOS current-mode folding amplifier circuit. And FIG. 8 is a graph showing the transfer curve of the current mirroring circuit of FIG. 7, illustrating the output current as a function of the input current. An embodiment of Block 2 42 from FIG. 4A, with an inverted output, is shown in the current mirroring circuit 70 of FIG. 7.

The current mirroring circuit 70 includes four MOSFETs, M1-M4, arranged in a current mirroring configuration, wherein two current mirrors are connected in cascade, and two MOSFETS, M5-M6, are arranged to provide the inverted output. The MOSFETs are configured to operate in an inversion region, for example. The first and second MOSFETs M1 and M2 form a first current mirror, the third and fourth MOSFETs M3 and M4 form a second current mirror, and the fifth and sixth MOSFETs M5 and M6 form a third current mirror. The first current mirror and the second current mirror are arranged in a non-inverting cascade configuration, and the third current mirror is arranged in an inverting cascade configuration. The first current mirror is adapted to receive the current source input current, and the third current mirror is adapted to provide an inverted second output current from the current source input current. The input-output characteristic, or transfer curve, of Block 2 41 is shown in FIG. 8.

With reference to FIG. 7 and FIG. 8, $$I_{02} = -I_2 \frac{\alpha_4}{\alpha_3} + I_1 \frac{\alpha_2 \alpha_4}{\alpha_1 \alpha_3} - I_{in} \frac{\alpha_2 \alpha_4}{\alpha_1 \alpha_3} \quad (4)$$

If $\alpha_1 \ll \alpha_2$ and $\alpha_3 = \alpha_4$ then:

$$I_{02} = -I_2 + I_1 \frac{\alpha_2}{\alpha_1} - I_{in} \frac{\alpha_2}{\alpha_1} \quad (5)$$

Or $$I_{02} = \begin{cases} -I_2, & \text{if } I_{in} \geq I_1 \\ 0, & \text{if } I_{in} \leq I_1 \end{cases} \quad (6)$$

The output current of FIG. 4A will be the sum of the two currents, resulting in:

$$I_{out} = I_{01} + I_{02} \quad (7)$$

Inspection of equations (3), (6) and (7) shows that the input-output characteristic shown in FIG. 4B can be obtained by proper selection of the biasing currents $I_1$ and $I_2$.

The assumption $\alpha_1 = \alpha_2$ and $\alpha_3 = \alpha_4$ results in a slope=1 for the characteristic shown in FIG. 4B. In general, using equation (1), the slope of the transfer characteristic for Block 1 is given by:

$$M = \frac{\alpha_2 \alpha_4}{\alpha_1 \alpha_3}.$$

The slope M can be controlled by the aspect ratios of the transistors M1-M4.

Figure 9A:
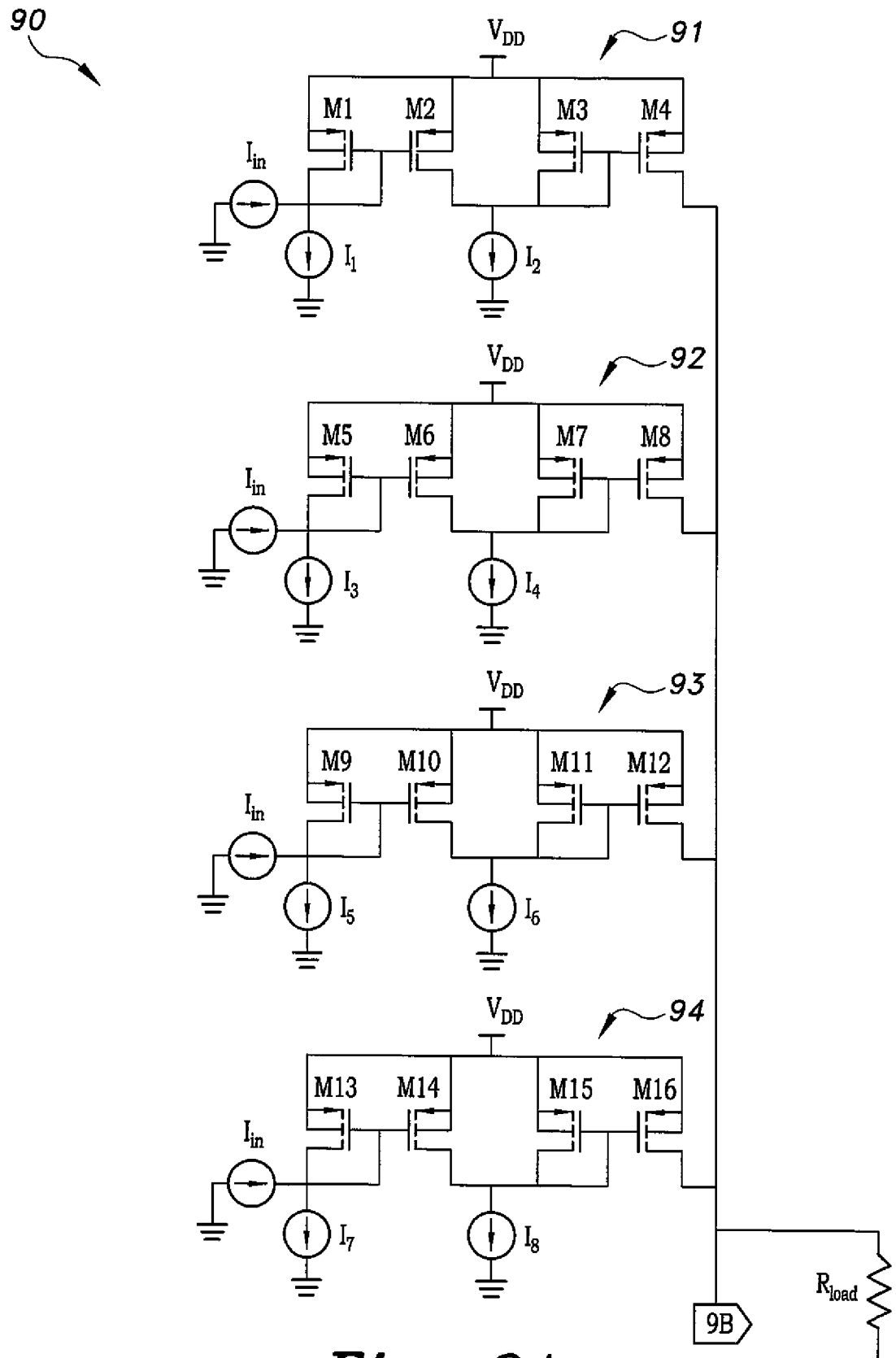
FIGS. 9A and 9B illustrate a schematic diagram of an alternative embodiment of a CMOS current-mode folding amplifier circuit having current mirrors that can be used in a current-mode folding amplifier, as an example of a circuit providing a folding factor, according to the present invention.
Figure 9B:
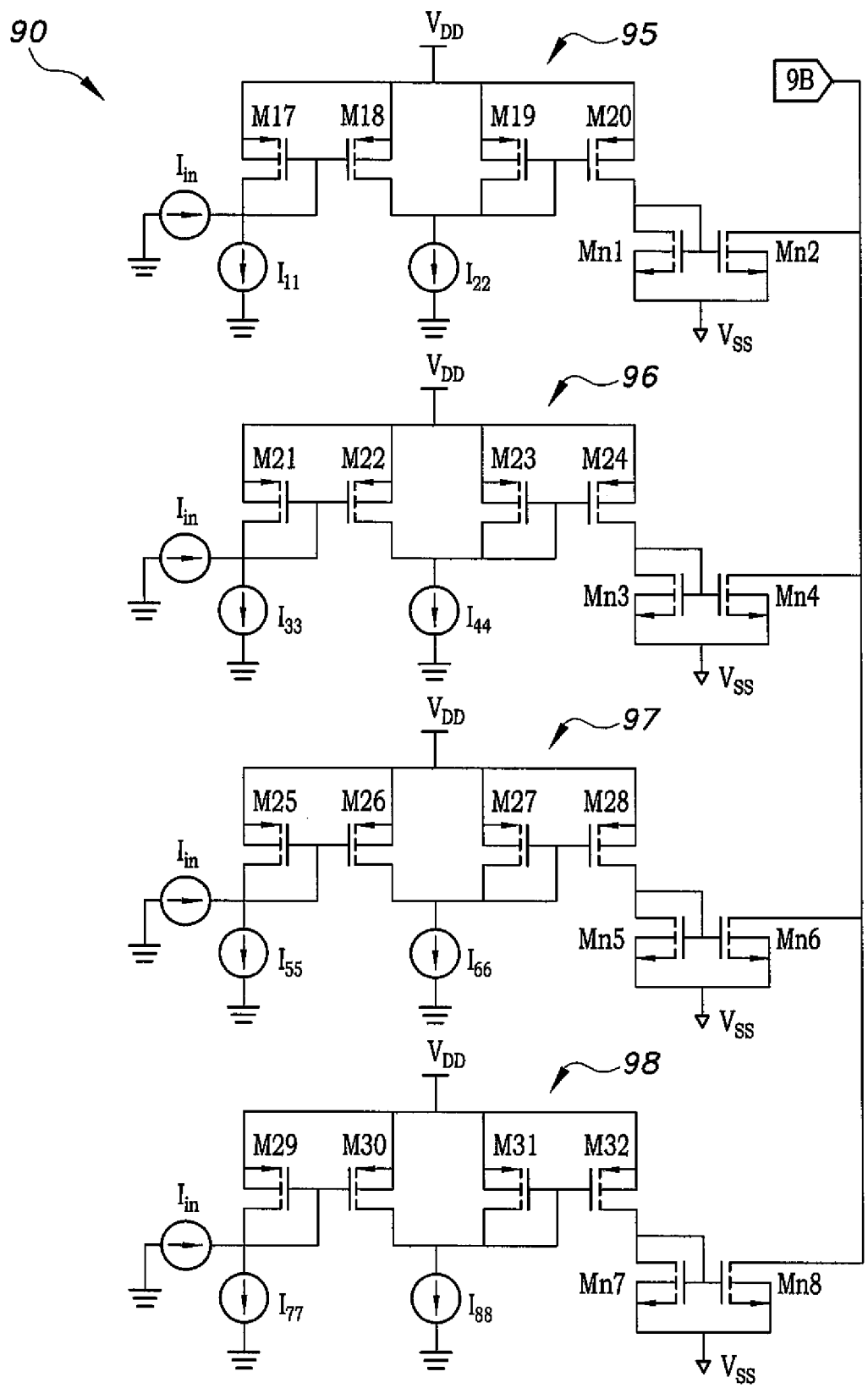

FIGS. 9A and 9B illustrate a schematic diagram of an alternative embodiment of a CMOS current-mode folding amplifier circuit having current mirrors that can be used in a current-mode folding amplifier providing a folding factor, for example. The alternative embodiment of FIGS. 9A and 9B includes the Block 1 41 circuit and Block 2 42 circuit of the current-mode folding amplifier in the CMOS current-mode folding amplifier circuit of FIG. 4A, with a folding factor of 4, for example.

The folding factor n can be a positive integer. Also, the folding factor n can be a number greater than or equal to one (1). Further, the number of each of the first current mirroring circuits included in the Block 1 41 circuit and the number of second current mirroring circuits included in the Block 2 42 circuit, can be equal to the folding factor n, for example, to provide a circuit with the corresponding folding factor, such as a folding factor of 4, illustrated in the CMOS current-mode folding amplifier circuit 90 of FIGS. 9A and 9B, for example. Also, in the CMOS current-mode folding amplifier circuit 90 of FIGS. 9A and 9B, all the MOSFETs' substrates' are connected to their corresponding sources, for example.

As illustrated in FIG. 9A, the Block 1 41 circuit includes four (4) current mirroring circuits 91, 92, 93 and 94 similar to the current mirroring circuit 50 of FIG. 5. Each of the current mirroring circuits 91-94 includes four MOSFETs, M1-M4, M5-M8, M9-M12 and M13-M16, respectively, arranged in a current mirroring configuration, wherein two current mirrors are connected in cascade. Also, as illustrated in FIG. 9B, the Block 2 42 circuit includes four (4) current mirroring circuits 95, 96, 97 and 99 similar to the current mirroring circuit 70 of FIG. 7. Each of the current mirroring circuits 95-98 includes four MOSFETs, M17-M20, M21-M24, M25-M28, M29-M32, respectively, arranged in a current mirroring configuration, wherein two current mirrors are connected in cascade, and two MOSFETS, Mn1-Mn2, Mn3-Mn4, Mn5-Mn6 and Mn7-Mn8, respectively, are arranged to provide the inverted output. The circuit of FIG. 9A is joined to the circuit of FIG. 9B at the arrowed box "9B". However, the number and arrangement of the circuits forming the Block 1 41 circuit and the Block 2 42 circuit should not be construed in a limiting sense, and can have any of various arrangements, depending on the use or application, such as to provide a particular folding factor, for example.

To verify the performance of the embodiments of a current-mode folding amplifier in CMOS current-mode folding amplifier circuit having current mirrors that can be used in a current-mode folding amplifier, the circuit 90 of FIGS. 9A and 9B was simulated using TANNER simulation tools in 0.35 µm CMOS process technology with the DC supply voltage as VDD=−VSS=1V and the bias currents assigned values of $I_1=I_{11}=9$ µA, $I_2=I_{22}=I_4=I_{44}=I_6=I_{66}=I_8=I_{88}=9$ µA, $I_7=I_{77}=4I_1$, $I_5=I_{55}=3I_1$, and $I_3=I_{33}=2I_1$. The Tanner simulation tools using 0.35 µm CMOS technology confirmed the functionality of the CMOS current-mode folding amplifier circuit 90, for embodiments of a CMOS current-mode folding amplifier circuit having current mirrors that can be used in a current-mode folding amplifier.

In this regard, in the simulation of the CMOS current-mode folding amplifier circuit 90 of FIGS. 9A and 9B, output current was measured by forcing it through a grounded resistive load of 1 kΩ. All transistors' aspect ratios are shown in Table 1.

TABLE 1

| Aspect Ratios of Transistors in circuit of FIG. 9 | |
|---|---|
| Transistor | Aspect Ratio W/L |
| M1, M2, M5, M6<br>M9, M10, M13, M14<br>M17, M21, M25, M29 | 2 µm/2 µm |
| M3, M4, M7, M8<br>M11, M12, M15, M16<br>M19, M20, M23, M24<br>M27, M28, M31, M32 | 4 µm/2 µm |
| M18, M22, M26, M30 | 50 µm/2 µm |
| Mn1, Mn2, Mn3, Mn4<br>Mn5, Mn6, Mn7, Mn8 | 2.4 µm/2 µm |

Figure 10:
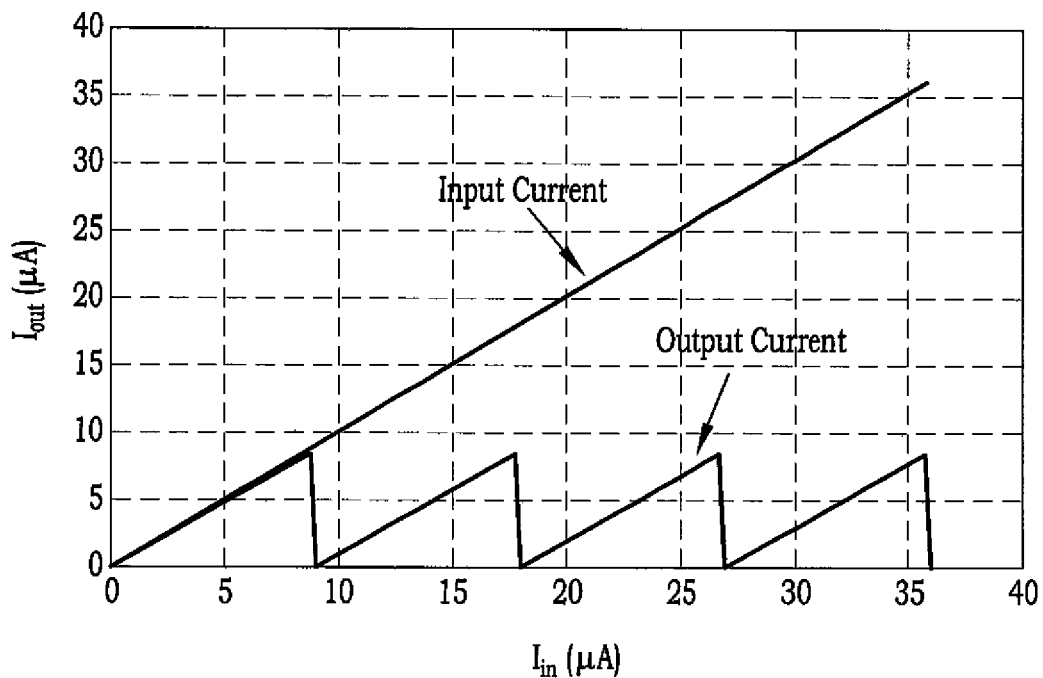
FIG. 10 is a plot illustrating a direct current (DC) simulation of the circuit of FIGS. 9A and 9B, where a saw-tooth shaped output current is produced from an input current, according to the present invention.

The DC simulation results of the CMOS current-mode folding amplifier circuit 90 of FIGS. 9A and 9B are shown in FIG. 10. Inspection of FIG. 10 shows that the simulated result is an output having a saw-tooth shaped wave characteristic.

Figure 11:
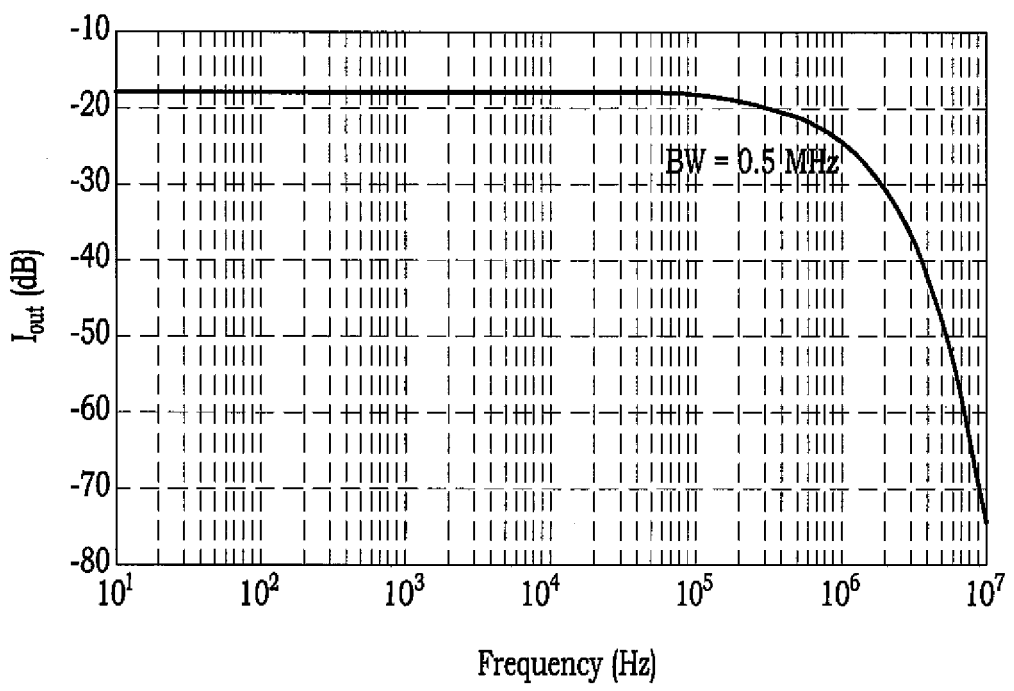
FIG. 11 is a graph illustrating an alternating current (AC) simulation of the frequency response of the circuit of FIGS. 9A and 9B, according to the present invention.

The results of the AC simulation for the frequency response of the CMOS current-mode folding amplifier circuit 90 of FIGS. 9A and 9B are shown in FIG. 11. An AC input current signal is applied, and the frequency is varied from 10 Hz to 10 MHz. Inspection of the plot of FIG. 11 shows that the bandwidth of the presented circuit 90 is 0.5 MHz.

Figure 12A:
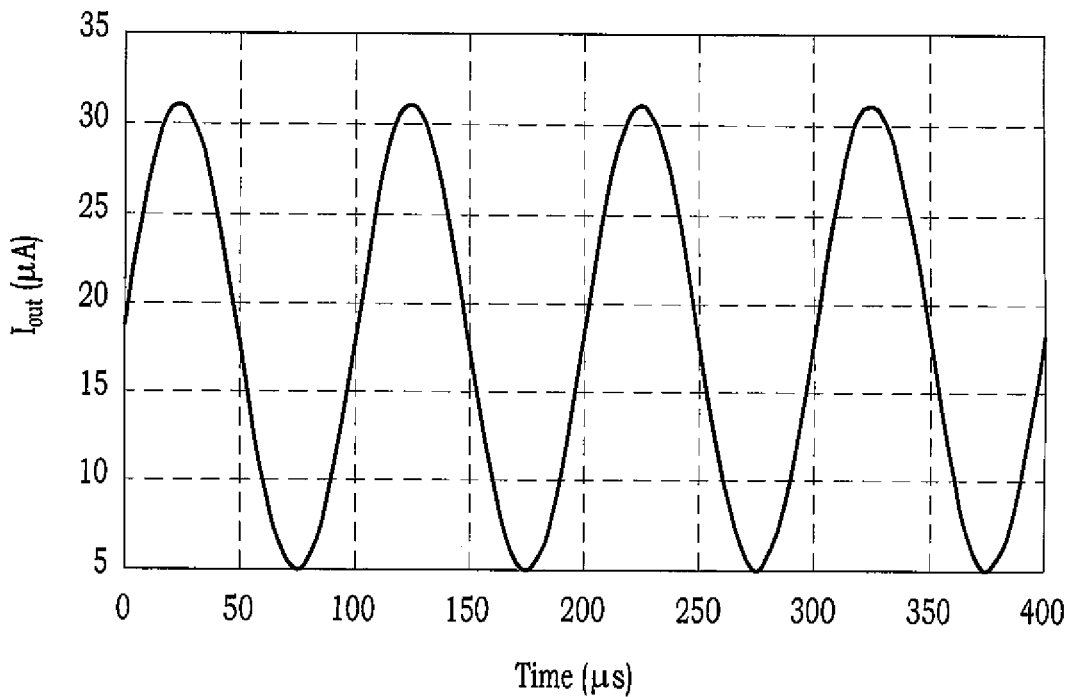
FIG. 12A is a graph illustrating a sine wave input applied to simulate a transient analysis in the circuit of FIGS. 9A and 9B, according to the present invention.
Figure 12B:
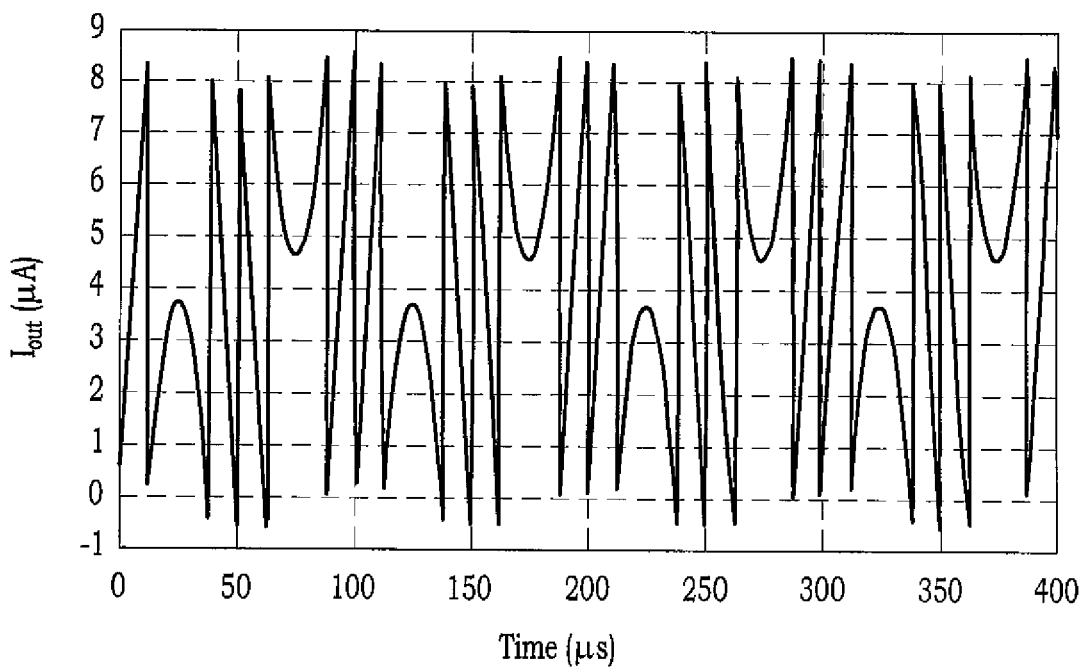
FIG. 12B is a graph illustrating a folded wave output as the transient response to the input of FIG. 12A in the circuit of FIGS. 9A and 9B, according to the present invention.

The input and output of the transient analysis simulation of the circuit 90 of FIGS. 9A and 9B are shown in FIGS. 12A and 12B, respectively. After the sine wave signal, as shown in FIG. 12A is applied as an input, the circuit 90 of the folding amplifier produces a folded wave output as shown in the graph of FIG. 12B.

Figure 13:
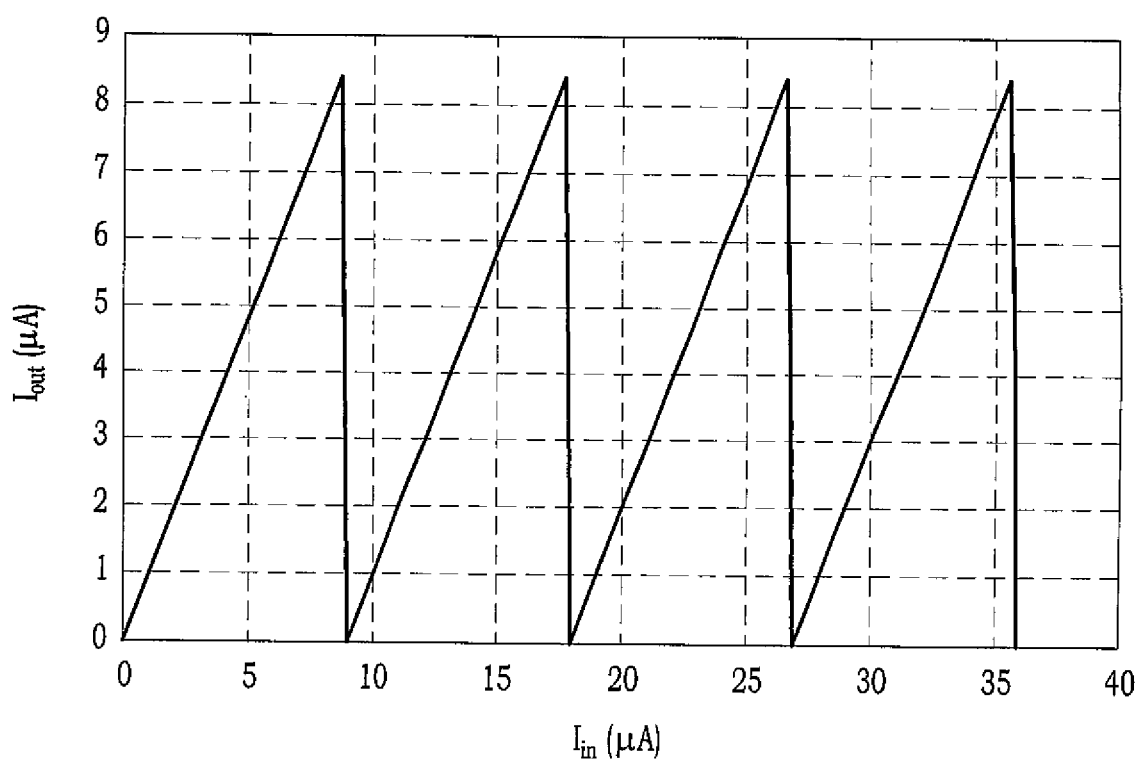
FIG. 13 is a graph illustrating an effect of process variations of channel width/channel length (W/L) on the input-output DC characteristic in the circuit of FIGS. 9A and 9B, according to the present invention.

FIG. 13 is a graph illustrating an effect of process variations of channel width/channel length (W/L) on the input-output DC characteristic in the CMOS current-mode folding amplifier circuit 90 of FIGS. 9A and 9B. Regarding mismatch analysis, in fabrication of a current-mode folding amplifier circuit, a number of current mirrors which may be susceptible to mismatch in device dimensions during the fabrication process may be used. The effect of device dimension mismatch on the CMOS current-mode folding amplifier circuit 90 is considered in FIG. 13, which shows the DC input-output characteristic when the channel lengths of the current mirrors are varied in steps of 0.05 μm. As illustrated in FIG. 13, the illustrated DC input-output characteristic corresponding to the varying channel lengths of the current mirrors of the CMOS current-mode folding amplifier circuit 90 indicates a relative insensitivity to mismatch in device dimensions.

Figure 14:
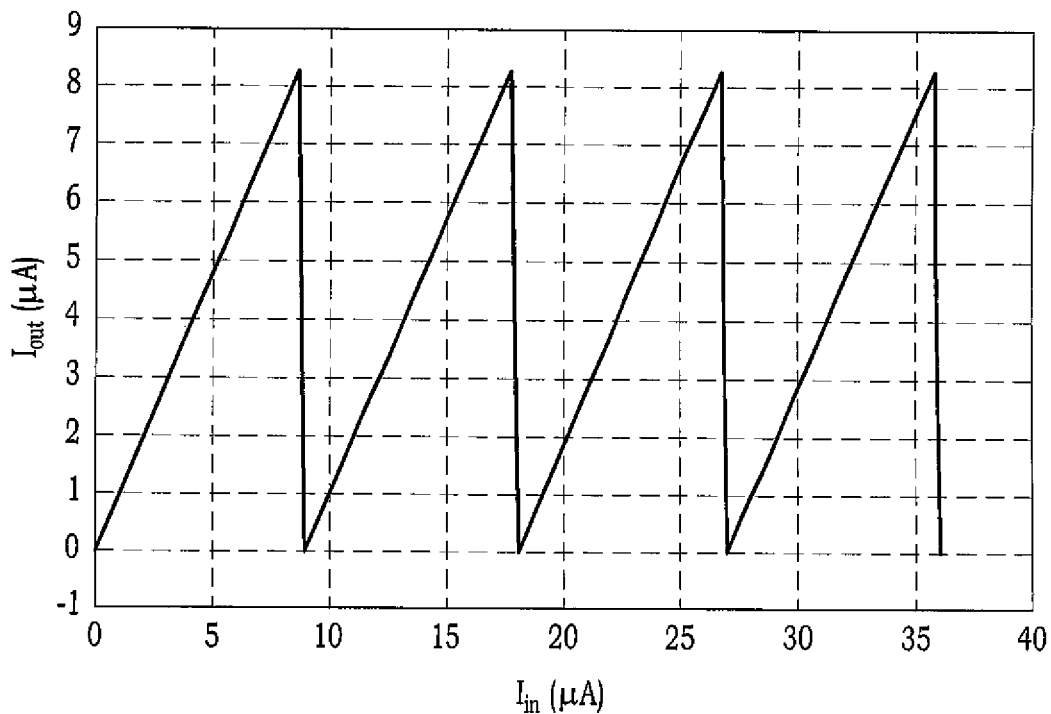
FIG. 14 is a graph illustrating the effect of temperature variations on the input-output DC characteristic in the circuit of FIGS. 9A and 9B, according to the present invention.

The results of the simulation for temperature variations on the input-output DC characteristic of the CMOS current-mode folding amplifier circuit 90 of FIGS. 9A and 9B are shown in FIG. 14. In the simulation, the temperature is swept from −25 C.° to 75 C.° in steps of 50 C.°. Inspection of the input-output DC characteristic illustrated in FIG. 14 confirms the circuit 90's relative insensitivity to temperature variations.

Figure 15:
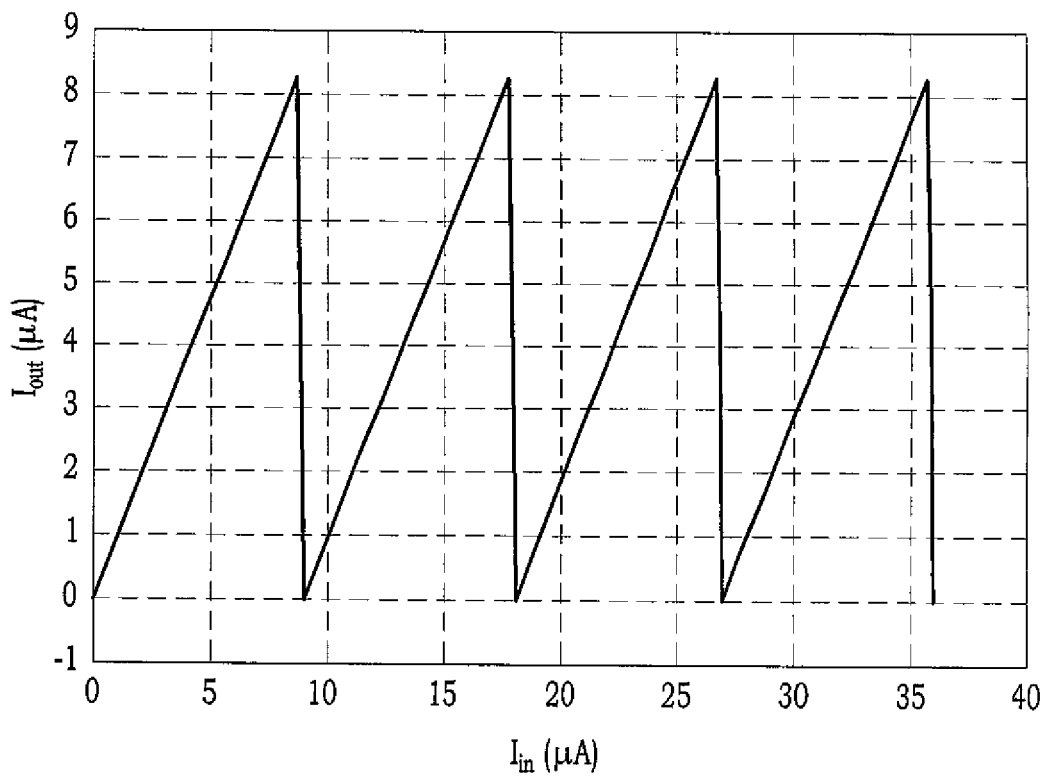
FIG. 15 is a graph illustrating an effect of power supply variations on the input-output DC characteristic in the circuit of FIGS. 9A and 9B, according to the present invention.

FIG. 15 is a graph illustrating an effect of power supply variations on the input-output DC characteristic in the CMOS current-mode folding amplifier circuit 90 of FIGS. 9A and 9B. The results of the simulation for power supply variations on the input-output DC characteristic are shown in FIG. 15. In the simulation, the supply voltage is varied between 0.9V and 1.1 V in steps of 0.1 V. Inspection of the input-output DC characteristic illustrated in FIG. 15 indicates that the folded signal shape generated by the CMOS current-mode folding amplifier circuit 90 retains or substantially retains its saw-tooth shaped waveform.

Therefore, embodiments of the CMOS current-mode folding amplifier circuit enable providing a saw-tooth signal, such as having a bandwidth of 0.5 MHz, for example. Furthermore, embodiments of the CMOS current-mode folding amplifier circuit produce a saw-tooth input-output characteristic which improves the accuracy of analog to digital conversion and enhances the current-mode folding ADC design. Also, embodiments of the CMOS current-mode folding amplifier circuit are advantageously relatively insensitive to fabrication process, temperature, and power supply variations.

It is to be understood that the present invention is not limited to the embodiments described above, but encompasses any and all embodiments within the scope of the following claims.

We claim:

1. A current-mode folding amplifier circuit, comprising:
   at least one first current mirroring circuit having a plurality of first current mirrors, each of the first current mirrors having a plurality of metal-oxide-semiconductor field-effect transistors (MOSFETs) configured for current biasing by a corresponding current source biasing current, the at least one first current circuit mirroring circuit being operable to generate a first output current responsive to a current source input current; and
   at least one second current mirroring circuit having a plurality of second current mirrors, each of the second current mirrors having a plurality of MOSFETs configured for current biasing by a corresponding current source biasing current, the current mirrors including at least one inverting current mirror, the at least one second current mirroring circuit being operable to generate a second output current responsive to the current source input current;
   wherein the at least one first current mirroring circuit and the at least one second current mirroring circuit are configured to produce a total output current, $I_{out}$, the total output current, $I_{out}$, comprising a sum of the first output current and the second output current, and
   wherein the total output current, $I_{out}$, produces a saw-tooth shaped waveform in response to the current source input current.

2. The current-mode folding amplifier according to claim 1, wherein the current-mode folding amplifier circuit comprises a complementary metal-oxide-semiconductor (CMOS) circuit.

3. The current-mode folding amplifier according to claim 1, wherein a number of the at least one first current mirroring circuit is equal to a number of the at least one second current mirroring circuit.

4. The current-mode folding amplifier according to claim 1, wherein a number of each of the first and second current mirroring circuits is equal to a folding factor n, where n is a positive integer.

5. The current-mode folding amplifier according to claim 4, wherein the total output current, $I_{out}$, produces the saw-tooth shaped waveform with the folding factor n in response to the current source input current.

6. The current-mode folding amplifier according to claim 1, wherein a number of each of the first and second current mirroring circuits is equal to a folding factor n, where n is a number greater than or equal to 1.

7. The current-mode folding amplifier according to claim 6, wherein the total output current, $I_{out}$, produces the saw-tooth shaped waveform with the folding factor n in response to the current source input current.

8. The current-mode folding amplifier according to claim 1, wherein the plurality of MOSFETs comprising each at least one first current mirroring circuit are arranged as cascade current mirrors and the plurality of MOSFETs comprising each at least one second current mirroring circuit are arranged as cascade current mirrors.

9. The current-mode folding amplifier according to claim 1, wherein the at least one first current mirroring circuit is described by a transfer curve relating the first output current to the current source input current as:

$$I_{01} = \begin{cases} I_2, & \text{if } I_{in} \geq I_1 \\ 0, & \text{if } I_{in} \leq I_1 - I_2 \end{cases},$$

where $I_{01}$ is the first output current, $I_{in}$ is the current source input current, $I_1$ and $I_2$ are the current source biasing currents, respectively.

10. The current-mode folding amplifier according to claim 1, wherein the at least one second current mirroring circuit is described by a transfer curve relating the second output current to the current source input current as:

$$I_{02} = \begin{cases} -I'_2, & \text{if } I'_{in} \geq I'_1 \\ 0, & \text{if } I'_{in} \leq I'_1 \end{cases},$$

where $I_{02}$ is the second output current, $I'_{in}$ is the current source input current, and $I'_1$ and $I'_2$ are the current source biasing currents, respectively.

11. The current-mode folding amplifier according to claim 1, wherein the at least one first current mirroring circuit comprises an arrangement of first, second, third, and fourth MOSFETs, the MOSFETs being configured to operate in an inversion region, wherein the first and second MOSFETs form a first current mirror, and the third and fourth MOSFETs form a second current mirror, the first and the second current mirrors being arranged in a non-inverting cascade configuration, wherein the first current mirror is adapted to receive the current source input current, and the second current mirror is adapted to provide the first output current.

12. The current-mode folding amplifier according to claim 11, wherein the first current mirror and the second current mirror are biased respectively by a first current source biasing current and a second current source biasing current in providing the first output current.

13. The current-mode folding amplifier according to claim 1, wherein the at least one second current mirroring circuit comprises an arrangement of first, second, third, fourth, fifth, and sixth MOSFETs, the MOSFETs being configured to operate in an inversion region, wherein the first and second MOSFETs form a first current mirror, the third and fourth MOSFETs form a second current mirror, and the fifth and sixth MOSFETs form a third current mirror, the first current mirror and the second current mirror being arranged in a non-inverting cascade configuration, and the third current mirror being arranged in an inverting cascade configuration, wherein the first current mirror is adapted to receive the current source input current, and the third current mirror is adapted to provide an inverted second output current from the current source input current.

14. A complementary metal-oxide-semiconductor (CMOS) current-mode folding amplifier, comprising:
at least one first current mirroring circuit having a plurality of first current mirrors; and
at least one second current mirroring circuit having a plurality of second current mirrors, wherein:
a number of the first current mirroring circuits is equal to a number of the second current mirroring circuits, and the number of each of the first and second current mirroring circuits is equal to a folding factor n;
each of the at least one first current mirroring circuits has a plurality of metal-oxide-semiconductor field-effect transistors (MOSFETs) configured for current biasing, the MOSFETs being arranged as cascade current mirrors, the at least one first current mirroring circuit being operable to generate a first output current responsive to a current source input current biased by corresponding current source biasing currents;
each of the least one second current mirroring circuits having a plurality of MOSFETs configured for current biasing, the MOSFETs being arranged as cascade current mirrors, the current mirrors including at least one inverting current mirror, the at least one second current mirroring circuit being operable to generate a second output current responsive to the current source input current biased by corresponding current source biasing currents;
the folding-factor of n is a positive integer;
the CMOS current-mode folding amplifier being configured to produce a total output current, $I_{out}$, the total output current, $I_{out}$, comprising a sum of the first and second output currents from the at least one first current mirroring circuit and the at least one second current mirroring circuit; and
the total output current, $I_{out}$, produces a saw-tooth shaped waveform with the folding factor n in response to the current source input current.

15. The CMOS current-mode folding amplifier according to claim 14, wherein
the at least one first current mirroring circuit is described by a transfer curve relating the first output current to the current source input current as:

$$I_{01} = \begin{cases} I_2, & \text{if } I_{in} \geq I_1 \\ 0, & \text{if } I_{in} \leq I_1 - I_2 \end{cases},$$

where $I_{01}$ is the first output current, $I_{in}$ is the current source input current, $I_1$ and $I_2$ are the current source biasing currents, respectively, and
the at least one second current mirroring circuit is described by a transfer curve relating the second output current to the current source input current as:

$$I_{02} = \begin{cases} -I'_2, & \text{if } I'_{in} \geq I'_1 \\ 0, & \text{if } I'_{in} \leq I'_1 \end{cases},$$

where $I_{02}$ is the second output current, $I'_{in}$ is the current source input current, and $I'_1$ and $I'_2$ are the current source biasing currents, respectively.

16. The CMOS current-mode folding amplifier according to claim 14, wherein the at least one first current mirroring circuit comprises an arrangement of first, second, third, and fourth MOSFETs, the MOSFETs being configured to operate in an inversion region, wherein the first and second MOSFETs form a first current mirror, and the third and fourth MOSFETs form a second current mirror, the first and the second current mirrors being arranged in a non-inverting cascade configuration, wherein the first current mirror is adapted to receive the current source input current, and the second current mirror is adapted to provide the first output current.

17. The CMOS current-mode folding amplifier according to claim 16, wherein the first current mirror and the second current mirror are biased respectively by a first current source biasing current and a second current source biasing current in providing the first output current.

18. The CMOS current-mode folding amplifier according to claim 14, wherein the at least one second current mirroring circuit comprises an arrangement of first, second, third, fourth, fifth, and sixth MOSFETs, the MOSFETs being configured to operate in an inversion region, wherein the first and second MOSFETs form a first current mirror, the third and fourth MOSFETs form a second current mirror, and the fifth and sixth MOSFETs form a third current mirror, the first current mirror and the second current mirror being arranged in a non-inverting cascade configuration, and the third current mirror being arranged in an inverting cascade configuration, wherein the first current mirror is adapted to receive the current source input current, and the third current mirror is adapted to provide for an inverted second output current from the current source input current.

19. The CMOS current-mode folding amplifier according to claim 18, wherein the first current mirror and the second current mirror are biased respectively by a first current source biasing current and a second current source biasing current in providing the inverted second output current by the third current mirror.

* * * * *